United States Patent
Bettiati et al.

(10) Patent No.: US 6,807,212 B2
(45) Date of Patent: Oct. 19, 2004

(54) SEMICONDUCTOR LASER

(75) Inventors: Mauro Bettiati, Fontenay Aux Roses (FR); Christophe Starck, Ste-Genevieve-des-Bois (FR); Stéphane Lovisa, Paris (FR)

(73) Assignee: Avanex Corporation, Fremont, CA (US)

( * ) Notice: Subject to any disclaimer, the term of this patent is extended or adjusted under 35 U.S.C. 154(b) by 0 days.

(21) Appl. No.: 10/283,133

(22) Filed: Oct. 30, 2002

(65) Prior Publication Data

US 2003/0086460 A1 May 8, 2003

(30) Foreign Application Priority Data

Oct. 31, 2001 (FR) .......................................... 01 14164

(51) Int. Cl.⁷ .............................................. H01S 5/00
(52) U.S. Cl. ........................... 372/45; 372/43; 372/46
(58) Field of Search .............................. 372/43, 45, 46

(56) References Cited

U.S. PATENT DOCUMENTS

| 5,594,749 A | 1/1997 | Behfar-Rad et al. |
| 6,304,587 B1 * | 10/2001 | Zah .............................. 372/46 |

FOREIGN PATENT DOCUMENTS

| EP | 0 908 988 A2 | 4/1999 |
| EP | 1 079 485 A1 | 2/2001 |
| WO | WO 91/16747 A1 | 10/1991 |

OTHER PUBLICATIONS

Hashimoto T et al: "Reduction of Beam Divergence Angle by Low–Refractive–Index Layers Introduced to Real–Refractive–Index–Guided GAALAS High–Power Laser Diodes" Japanese Journal of Applied Physics, Publication Office Japanese Journal of Applied Physics. Tokyo, JP vol. 36, No. 5A, May 1, 1997, pp. 2676–2680, XP000732382.

\* cited by examiner

*Primary Examiner*—Don Wong
*Assistant Examiner*—Cornelius H. Jackson
(74) *Attorney, Agent, or Firm*—Moser, Patterson & Sheridan, L.L.P.

(57) ABSTRACT

The present invention provides a vertical structure semiconductor laser comprising bottom and top cladding layers (1, 2), a light guide (G) superposed on the bottom cladding layer, and a semiconductor active layer (CA). In the invention, the light guide (G) further comprises:

- a semiconductor bottom guide layer (11) having the following two adjacent bottom parts:
    - an undoped first bottom part (11*a*) adjacent the central region, and
    - an n-type doped second bottom part (11*b*) adjacent the bottom cladding layer,
- a semiconductor top guide layer (12) having the following two adjacent top parts:
    - an undoped first top part (12*a*) adjacent the central region, and
    - a p-type doped second top part (12*b*) adjacent the top cladding layer.

The first bottom and top parts form a non-doped region (ND) more than 0.5 $\mu$m thick, and the refractive index difference ($\Delta n_{opt}$) between one or each of the cladding layers and the adjacent guide layer is less than 0.02.

8 Claims, 1 Drawing Sheet

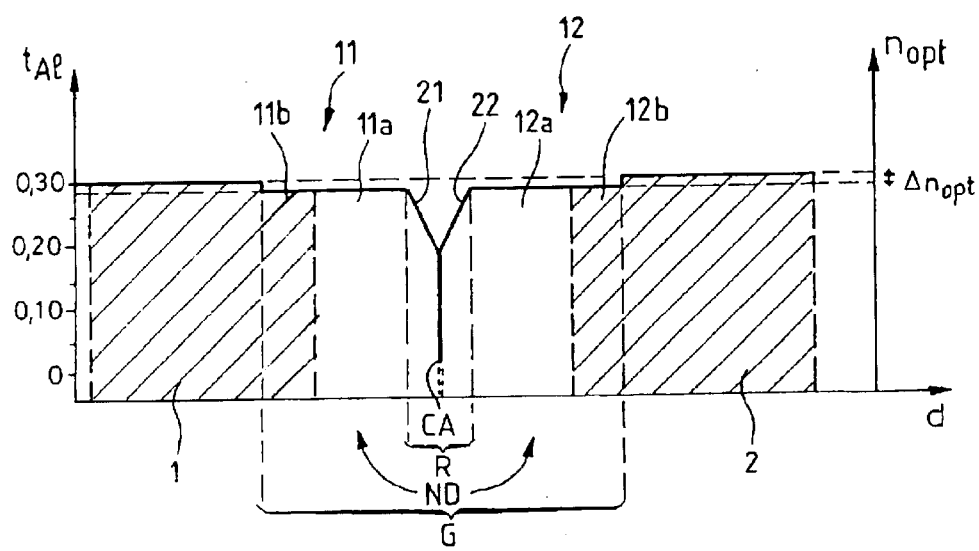
FIG_1
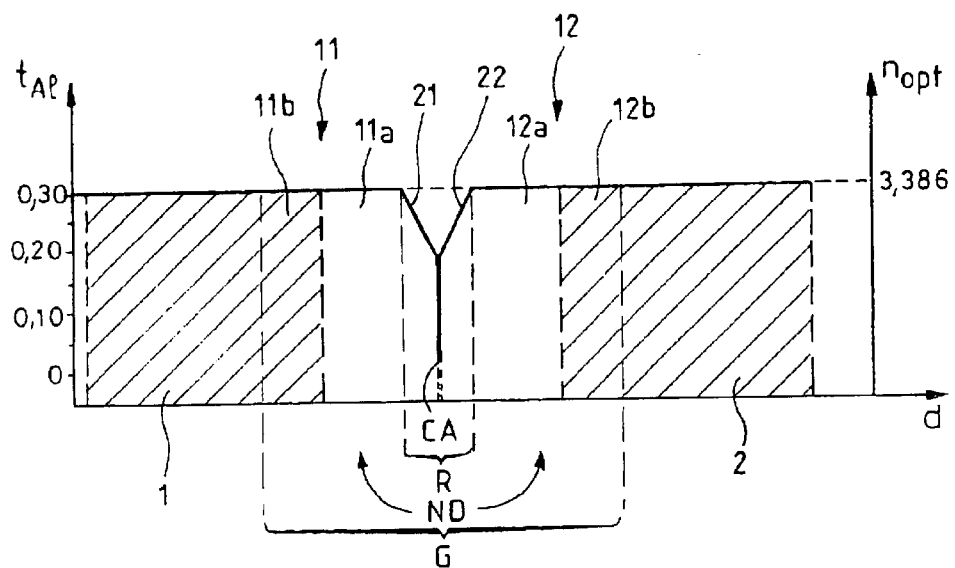
FIG_2

SEMICONDUCTOR LASER

CROSS-REFERENCE TO RELATED APPLICATIONS

This application claims priority, under 35 USC § 119, to French Patent Application No. 01 14 164, filed Oct. 31, 2001.

BACKGROUND OF THE INVENTION

1. Field of the Invention

The field of the present invention is that of semiconductor optical components, to be more precise semiconductor lasers.

2. Description of the Related Art

As is known in the art, semiconductor lasers are used in many applications and in particular for pumping solid state lasers or amplifiers consisting of optical fibers doped with rare earths. Semiconductor lasers comprise an active layer based on arsenic, gallium and/or phosphorus and indium. When supplied with a current made up of p-type and n-type charge carriers, the active layer emits laser radiation which can be amplified and at wavelengths that are generally in a band around 808 nm, 920 nm, 940 nm or 1480 nm, and in particular around 980 nm, the latter wavelength being used to pump monomode fiber amplifiers in optical telecommunication applications.

The above kind of laser, which is often of the rectangular block type, can have front and rear lateral faces cleaved to form faceted mirrors so that longitudinal Fabry-Pérot propagation modes are established in the laser: this type of component exhibits multimode behavior in the spectral domain and monomode behavior in the TE (transverse electric) spatial domain.

Throughout the remainder of this description, the term "layer" may refer to a single layer or to a stack of layers having the same function.

High-power semiconductor lasers provide a high output optical power. Their performance increases as internal losses and vertical divergence of the laser radiation at the output are reduced, in particular to optimize the rate of coupling into an optical fiber.

The vertical divergence at the output is reduced by modifying the optical mode guidance properties, for example, and especially by increasing optical mode vertical spreading, which increases internal losses. Because these two parameters are interrelated, a compromise must generally be found to enable them to be adjusted at the same time.

U.S. Pat. No. 5,594,749 discloses a semiconductor laser designed to have a low vertical far field (VFF), i.e. a divergence less than 30°. In one of the embodiments described therein, the laser comprises the following successive layers:

an n-doped $Al_{0.40}Ga_{0.60}As$ bottom cladding layer 2.5 µm thick, an undoped $Al_xGa_{1-x}As$ bottom barrier layer, with x varying from 0.40 to 0.25 and having a linearly varying refractive index, i.e. a graded index (GRIN) layer, 100 nm thick, an undoped GaAs active layer with quantum wells, 7 nm thick, an undoped graded index $Al_xGa_{1-x}As$ top barrier layer, with x varying from 0.25 to 0.40 and 100 nm thick, the last three layers being included in a light guide region 0.27 µm thick, and a p-doped $Al_{0.40}Ga_{0.60}As$ top cladding layer 1.85 µm thick.

Performance in terms of divergence and internal losses (as indicated by the radiation absorption coefficient (expressed in $cm^{-1}$) in the lossy regions) as a function of the chosen thickness of the doped cladding layers is shown in the form of graphs.

The graphs show that, for a given thickness, divergence decreases and absorption increases as the aluminum ratio decreases.

In all the embodiments described, the light guide of the laser forms a thin undoped central region and the internal losses are therefore not totally compensated, because low divergence is obtained at the cost of a non-negligible increase in internal losses.

An object of the present invention is to provide a semiconductor laser having minimum internal losses combined with minimum vertical divergence and based on a vertical semiconductor layer structure that is simple and easy to produce.

SUMMARY OF THE INVENTION

To this end, the present invention proposes a vertical structure semiconductor laser comprising:

an n-type doped semiconductor bottom cladding layer, a light guide superposed on the bottom cladding layer and including a central region including an semiconductor active layer, and a p-type doped semiconductor top cladding layer superposed on said light guide, which laser is characterized in that said light guide further comprises:

a semiconductor bottom guide layer having the following two adjacent bottom parts:

an undoped first bottom part adjacent the central region, and an n-type doped second bottom part adjacent the bottom cladding layer, a semiconductor top guide layer having the following two adjacent top parts:

an undoped first top part adjacent the central region, and a p-type doped second top part adjacent the top cladding layer, in that the first bottom and top parts form a non-doped region more than 0.5 µm thick, and in that the refractive index difference between one or each cladding layer and the adjacent guide layer is less than 0.02.

In accordance with the invention, because of the insertion of the guide layers, the light guide is much thicker than that of prior art lasers. The resulting vertical spreading of the optical mode produces low vertical divergence at the output of the laser of the invention.

Moreover, the low (or even zero) index step between the cladding layer and the adjacent guide layer helps to reduce the divergence.

With regard to internal losses, it is known in the art that one cause of increased internal losses in a laser is interaction between the n-type or p-type charge carriers and the electromagnetic field of the optical mode. In the invention, to limit the penetration of the field into the doped areas, the first parts of the guide layers are not doped. The internal losses are therefore of the same order as those of a thinner light guide with a high rate of confinement of the electromagnetic field and greater divergence.

In the invention, the semiconductor layers do not install barriers or potential wells on the path of the n-type or p-type charge carriers. The electrical behavior and the thermal behavior of a laser of the invention are therefore satisfactory.

A high-power laser generally operates at a current equal to approximately ten times the threshold current. The threshold current of a laser of the invention can easily be kept to a level compatible with high-power operation.

The thickness of the non-doped region (ND) can advantageously be substantially equal to 0.8 μm. In the invention, the combined thickness of the bottom and top guide layers can be from 1.2 μm to 1.5 μm.

There is therefore a limit on guide layer thickness so that their contribution to the series resistance of the laser of the invention remains acceptable and they do not encourage the appearance of higher transverse modes likely to produce laser radiation.

In an advantageous embodiment, the refractive index difference between a cladding layer and the adjacent guide layer is substantially equal to zero.

This minimizes the divergence.

In the invention, the bottom and top guide layers can be of the same semiconductor material and preferably of a compound containing arsenic, gallium and aluminum with an aluminum atomic ratio from 0.25 to 0.30.

A compound of the above type with an aluminum atomic ratio of 0.27, denoted $Al_{0.27}Ga_{0.73}As$, gives a refractive index approximately equal to 3.37. For example, the cladding layers can be of $Al_{0.30}Ga_{0.70}As$, giving an index step of 0.016.

Moreover, the central region can comprise:

an undoped semiconductor bottom barrier layer between the first bottom part and the active layer, and an undoped semiconductor top barrier layer between the first top part and the active layer, and, according to the invention, the top and bottom barrier layers can be of the same semiconductor material, for a simpler structure, and preferably of the same compound containing arsenic, gallium and aluminum.

The higher the aluminum atomic ratio, the lower the refractive index. A high refractive index in the vicinity of the active layer provides sufficient optical confinement.

BRIEF DESCRIPTION OF THE DRAWINGS

In an embodiment of the invention, one or each of the barrier layers is a graded index layer and, to improve the operation of the light guide, has a refractive index in the vicinity of the active layer greater than the refractive index in the vicinity of the adjacent guide layer.

The objects and features of the present invention emerge from the detailed description given hereinafter with reference to the accompanying drawings, which are provided by way of illustrative and non-limiting example.

In the figures:

FIG. 1 shows diagrammatically refractive index and aluminum atomic ratio profiles of semiconductor layers as a function of their vertical position in a first embodiment of a semiconductor laser of the invention, and FIG. 2 shows diagrammatically refractive index and aluminum atomic ratio profiles of semiconductor layers as a function of their vertical position in a second embodiment of a semiconductor laser of the invention.

DETAILED DESCRIPTION OF THE PREFERRED EMBODIMENT

A semiconductor laser of the invention can be used in high-power applications and in particular as a 0.0980 μm optical fiber pumping source.

Of course, a laser of the invention conventionally comprises a GaAs substrate on which a bottom cladding layer 1 is first deposited, for example by metal organic vapor phase epitaxy (MOVPE). Note also that to encourage the growth of subsequent layers the substrate can comprise a GaAs buffer layer a few hundred manometers thick and grown epitaxially, for example.

The laser of the invention comprises, as is known in the art, a strongly p-type doped semiconductor contact layer superposed on a top cladding layer 2 and a p-doped metal electrode layer deposited on the contact layer and connected to a supply of current.

FIG. 1 shows diagrammatically the refractive index profile $n_{opt}$ and aluminum atomic ratio profile $t_{Al}$ of the semiconductor layers as a function of their vertical position d in a first embodiment of a semiconductor laser of the invention.

In this first embodiment, the vertical structure laser of the invention comprises, in this order:

an n-type doped $Al_{0.30}Ga_{0.70}As$ semiconductor bottom cladding layer 1 about 2 μm thick, for example, a wide light guide G, and a p-type doped $Al_{0.30}Ga_{0.70}As$ semiconductor top cladding layer 2 about 2 μm thick, for example.

The wide guide G comprises, in this order:

an $Al_{0.27}Ga_{0.73}As$ semiconductor bottom guide layer 11 with a total thickness of approximately 0.6 μm and comprising:

an undoped first bottom part 11a adjacent the central region R and approximately 0.4 μm thick, and a n-type doped second bottom part 11b adjacent the bottom cladding layer 1 and approximately 0.2 μm thick, a central region R comprising, in succession:

an undoped graded index (for example) $Al_xGa_{1-x}As$ semiconductor bottom barrier layer 21, with x varying from 0.27 to 0.18 and from 80 nm to 100 nm thick, an undoped GaAs or InGaAs semiconductor active layer Ca including one or more quantum wells and from 7 nm to 10 nm thick, and an undoped graded index (for example) $Al_xGa_{1-x}As$ semiconductor top barrier layer 22, with x varying from 0.18 to 0.27 and from 80 nm to 100 nm thick, and an $Al_{0.27}Ga_{0.73}As$ semiconductor top guide layer 12 with a total thickness of approximately 0.6 μm and comprising:

an undoped first top part 12a adjacent the central region R and approximately 0.4 μm thick, and a p-type doped second top part 12b adjacent the top cladding layer 2 and approximately 0.2 μm thick.

The shaded doped layers are therefore the cladding layers 1, 2 and the second bottom and top parts 11b, 12b. The first bottom and top parts 11a, 12a form an intentionally non-doped region ND approximately 0.8 μm thick.

As shown in FIG. 1, the refractive index difference $\Delta n_{opt}$ between a cladding layer 1, 2 and the adjacent guide layer 11, 12 is substantially equal to 0.016.

The laser has a vertical divergence from 23° to 25° and low internal losses of around 1.5 $cm^{-1}$. The combined thickness of the bottom and top guide layers 11, 12 is equal to 1.2 μm. Note that increasing the combined thickness to 1.4 μm by increasing the thickness of each second part 11b, 12b by 0.1 μm has the advantage of producing a vertical divergence from 21° to 23° and very low internal losses of less 1 $cm^{-1}$.

FIG. 2 shows diagrammatically the refractive index profile $n_{opt}$ and the aluminum atomic ratio profile $t_{Al}$ of the semiconductor layers as a function of their vertical position in a second embodiment of a semiconductor laser of the invention.

Only the differences compared to the first embodiment are described.

The bottom and top barrier layers 21, 22 are of $Al_xGa_{1-x}As$, with x varying from 0.18 to 0.30.

The bottom and top guide layers 11, 12 are of $Al_{0.30}Ga_{0.70}As$ with a refractive index equal to approximately 3.386 and each having a total thickness equal to approximately 0.7 μm. The second top and bottom parts 11b, 12b are approximately 0.3 μm thick.

As shown in FIG. 2, the refractive index difference between a cladding layer 1, 2 and the adjacent guide layer 11, 12 is substantially equal to zero.

This second embodiment of a laser of the invention has a vertical divergence from 13° to 16° and internal losses less than 1.5 cm$^{-1}$.

The foregoing description has been given by way of purely illustrative example. Any means described can be replaced by equivalent means without departing from the scope of the invention.

The compounds constituting the active layer and the barrier layers and the compounds constituting the guide layers and the adjacent cladding layers are indicated by way of example.

For example, ternary or quaternary semiconductor compounds can be used, such as $In_xGa_{1-x}P$, $In_xGa_{1-x}As$ or InGaAsP.

Similarly, constant refractive index barrier layers can be used equally as well as graded index barrier layers, which can be linear or parabolic.

Furthermore, in the invention, the doping in the second bottom and top parts can be constant over the whole of the thickness of those layers or lower in the vicinity of the first bottom and top parts.

The laser of the invention can be of the buried stripe or other type.

The lasers are transverse monomode lasers in the embodiments shown. The invention applies equally to lasers employing transverse multimode propagation of light, such as wide contact lasers or multistripe power laser strips.

What is claimed is:

1. A vertical structure semiconductor laser comprising:
    an n-type doped semiconductor bottom cladding layer,
    a light guide superposed on the bottom cladding layer and including a central region including a semiconductor active layer, and
    a p-type doped semiconductor top cladding layer superposed on said light guide, which laser is characterized in that said light guide further comprises:
    a semiconductor bottom guide layer having the following two adjacent bottom parts:
        an undoped first bottom part adjacent the central region, and
        an n-type doped second bottom part adjacent the bottom cladding layer,
    a semiconductor top guide layer having the following two adjacent top parts:
        an undoped first top part adjacent the central region, and
        a p-type doped second top part adjacent the top cladding layer,
    in that the first bottom and top parts form a non-doped region more than 0.5 μm thick, and in that the refractive index difference between one or each cladding layer and the adjacent guide layer is less than 0.02.

2. A semiconductor laser according to claim 1, characterized in that the thickness of the non-doped region (ND) is substantially equal to 0.8 μm.

3. A semiconductor laser according to claim 1, characterized in that the combined thickness of the bottom and top guide layers is from 1.2 μm to 1.5 μm.

4. A semiconductor laser according to claim 1, characterized in that said refractive index difference between a cladding layer and the adjacent guide layer is substantially equal to zero.

5. A semiconductor laser according to claim 1, characterized in that said bottom and top guide layers are of the same semiconductor material and preferably of a compound containing arsenic, gallium and aluminum with an aluminum atomic ratio from 0.25 to 0.30.

6. A semiconductor laser according to claim 1, characterized in that said central region R comprises:
    an undoped semiconductor bottom barrier layer between the first bottom part and the active layer, and
    an undoped semiconductor top barrier layer between the first top part and the active layer, the top and bottom barrier layers being of the same semiconductor material.

7. A semiconductor laser according to claim 6, characterized in that the bottom and top barrier layers are of the same compound containing arsenic, gallium and aluminum.

8. A semiconductor laser according to claim 6, characterized in that one or each of said barrier layers is a graded index layer and has a refractive index in the vicinity of said active layer greater than the refractive index in the vicinity of the adjacent guide layer.

* * * * *